(12) United States Patent
Lutze

(10) Patent No.: US 6,492,695 B2
(45) Date of Patent: *Dec. 10, 2002

(54) SEMICONDUCTOR ARRANGEMENT WITH TRANSISTOR GATE INSULATOR

(75) Inventor: Jeffrey Lutze, San Jose, CA (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/250,590

(22) Filed: Feb. 16, 1999

(65) Prior Publication Data

US 2002/0089022 A1 Jul. 11, 2002

(51) Int. Cl.[7] .............................................. H01L 29/76
(52) U.S. Cl. ...................................... 257/410; 257/411
(58) Field of Search ................................. 257/410, 411

(56) References Cited

U.S. PATENT DOCUMENTS

| | | | |
|---|---|---|---|
| 3,886,584 A | * 5/1975 | Cook, Jr. et al. | 257/410 |
| 4,056,825 A | 11/1977 | Esch | 357/23 |
| 4,485,390 A | * 11/1984 | Jones et al. | 257/404 |
| 5,291,050 A | 3/1994 | Nishimura | 257/340 |
| 5,621,236 A | 4/1997 | Choi et al. | 257/389 |
| 5,661,048 A | 8/1997 | Davies et al. | 438/217 |
| 5,750,435 A | * 5/1998 | Pan | 438/525 |
| 5,814,863 A | * 9/1998 | Pan | 257/410 |
| 5,990,532 A | * 11/1999 | Gardner | 257/410 |
| 6,104,077 A | * 8/2000 | Gardner et al. | 257/410 |
| 6,107,667 A | * 8/2000 | An et al. | 257/410 |
| 6,127,251 A | * 10/2000 | Gardener et al. | 257/410 |
| 6,194,768 B1 | * 2/2001 | Gardner et al. | 257/410 |

FOREIGN PATENT DOCUMENTS

| JP | 53-10283 | * 1/1978 | 257/410 |
|---|---|---|---|

OTHER PUBLICATIONS

IBM Technical Disclosure Bulletin, vol. 38, No. 10, p. 573, Oct. 1995.*

Tseng H.–H. et al., Application of JVD Nitride Gate Dielectric to A 0.35 Micron CMOS Process for Reduction of Gate Leakage Current and Boron Penetration, Electron Devices Meeting, 1997, Technical Digest., International, pp. 647–650., 12/97.

S.S. Roth et al., Polysilicon Encapsulated Local Oxidation, IEEE Electron Device Letters, vol. 12, No. 3, Mar. 1991, pp. 92–94.

* cited by examiner

Primary Examiner—Mark V. Prenty
(74) Attorney, Agent, or Firm—Peter Zawilski

(57) ABSTRACT

According to one example embodiment, the present invention is directed to a semiconductor device, wherein the device includes a transistor having source and drain regions separated by a channel region. The device includes a gate formed over the channel region and formed over part of the source region and over part of the drain region. The device further includes an insulator region configured and arranged to insulate the gate from the channel region and from the source and drain regions. The insulator region has a first material arranged over the channel region and providing a high dielectric constant, and has a second material arranged over part of the source region and over part of the drain region and providing a significantly lower dielectric constant. By using insulator materials having different dielectric constants, this embodiment not only meets the compact size requirements of higher-functioning devices, but also adequately insulates the gate and channel regions and improves the transistor performance.

3 Claims, 2 Drawing Sheets

US 6,492,695 B2

SEMICONDUCTOR ARRANGEMENT WITH TRANSISTOR GATE INSULATOR

FIELD OF THE INVENTION

The present invention relates generally to semiconductor devices and their fabrication and, more particularly, to semiconductor devices and their manufacture involving dielectrics used with transistors.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. In addition, many of the individual devices within the wafer are being manufactured with smaller physical dimensions. As The number of electronic devices per given area of the silicon wafer increases, and as the size of the individual devices decreases, the manufacturing process becomes difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS), complementary MOS (CMOS), bipolar complementary MOS (BiCMOS), and bipolar transistors.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions.

As devices are scaled below 0.18 microns, gate insulator thicknesses reach the quantum mechanical regime. One gate insulator material used in this regime is silicon dioxide. Current research indicates that silicon dioxide thicknesses of 20–25 angstroms will result in unacceptably large tunneling currents. To alleviate this problem, research has begun on alternatives to silicon dioxide that have larger dielectric constants. This allows the use of thicker gate insulators, diminishing the gate tunneling current without reducing the gate capacitance. However, large capacitance is not desirable in the source-drain overlap regions of the gate because it increases the gate to source-drain, or overlap, capacitance and degrades transistor performance. The gate-to-drain capacitance is particularly critical for transistor performance as it is amplified during switching due to the Miller effect.

Previous work on this problem has mostly focused on thickening the gate oxide over the source-drain region to reduce overlap capacitance. This provides only a modest reduction in overlap capacitance and creates stress in the gate.

With the demands for increasing the density of such MOS-based circuits continuing to escalate, there is an ongoing need to reduce the amount of real estate consumed by various aspects of the circuits and to minimize the complexities and deficiencies resulting from manufacturing processes.

SUMMARY OF THE INVENTION

The present invention is directed to a transistor gate insulator material that not only meets the compact size requirements of higher-functioning devices but also adequately insulates the gate and channel regions and improves the transistor performance. The present invention is exemplified in a number of implementations and applications, some of which are summarized below.

According to an example embodiment, the present invention is directed to a semiconductor device that includes a transistor comprising source and drain regions separated by a channel region. A gate is formed over the channel region, over part of the source region, and over part of the drain region. An insulator region is configured and arranged to insulate the gate from the channel region and from the source and drain regions. The insulator region has a first material arranged substantially over the channel region and providing a high dielectric constant, and a second material arranged substantially over part of the source region and over part of the drain region and providing a significantly lower dielectric constant.

In another example embodiment, the present invention is directed to a method for manufacturing a semiconductor device. The device includes source and drain regions separated by a channel region, and an insulator region. The insulator region is over-etched to form recesses at corners of the gate adjacent the source and drain regions. A second material is formed in the recesses.

In yet another example embodiment, a semiconductor device that includes a transistor having source and drain regions separated by a channel region is provided. A gate is formed over the channel region, over part of the source region, and over part of the drain region. An insulator region is configured and arranged to insulate the gate from the channel region and from the source and drain regions. The insulator region has means, arranged over the channel region, for providing a high dielectric constant. The insulator region also has means, arranged over the part of the source region and over the part of the drain region, for providing a significantly lower dielectric constant.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description in connection with the accompanying drawings, in which.

Figure 1:
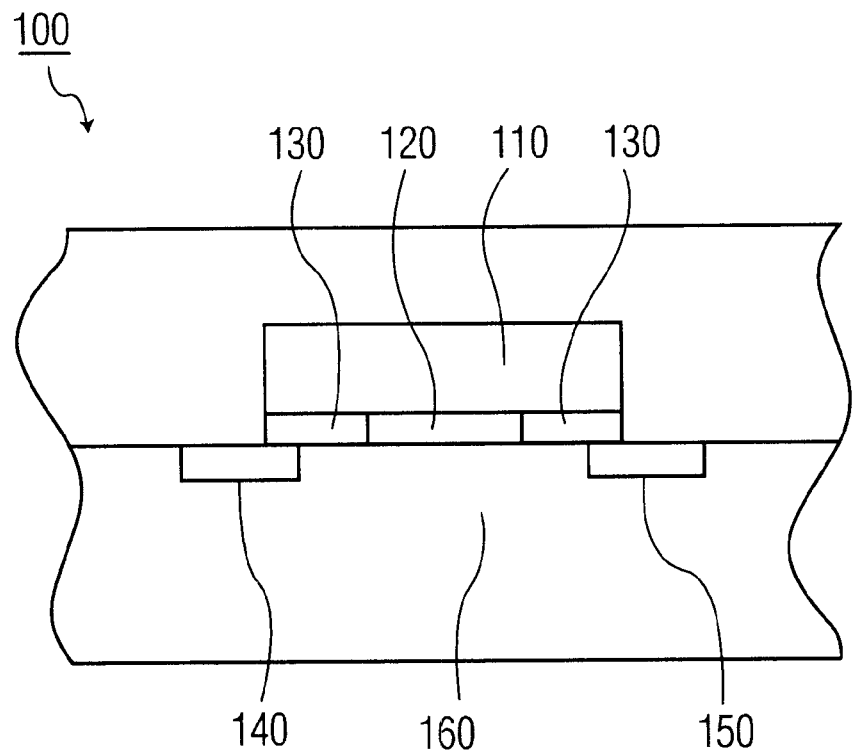
FIG. 1 is a cross-sectional view of a semiconductor device with an insulator region adjacent to source, drain, channel, and gate regions, according to an example embodiment of the present invention.

While the invention is amenable to various modifications and alternative forms, certain specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is directed to using decreased gate insulator thicknesses while maintaining or improving transistor performance; and applicable, for example, where gate insulator thicknesses are reduced to 20–25 angstroms and where unacceptable large tunneling currents occur. The present invention has been found to be particularly advantageous for use in applications requiring small insulator thicknesses when using a combination of insulator materials such as silicon nitride, silicon dioxide, tantalum oxide, or fluorine-doped silicon oxide (SiOF). While the present invention is not necessarily limited to these materials, an appreciation of various aspects of the invention may be appreciated through a discussion of one or more examples using this context.

According to an example embodiment, the present invention is directed to a semiconductor device that has source and drain regions separated by a channel region. A gate is located over the channel region, over part of the source region, and over part of the drain region. An insulator region is positioned between the gate and the source, drain, and channel regions. The insulator region has a first material having a high dielectric constant arranged substantially over the channel region, and a second material having a low dielectric constant arranged substantially over part of the source region and part of the drain region. A notable advantage of this arrangement is that, in using an insulator layer comprising a combination of materials with different dielectric constants, the gate to channel capacitance remains high, reducing tunneling currents, and the overlap capacitance is reduced, improving the transistor performance.

The insulator material may be arranged with certain portions of the first or second material over respective portions of the source, drain, and channel regions. For instance, the first material may be arranged to overlap both the channel, source, and drain regions. The first material may also be arranged to overlap only the channel region. In addition, the second material may be arranged to overlap only the source and drain regions. The second material may also be arranged to overlap the channel, source, and drain regions.

FIG. 1 shows a transistor device 100, according to another example embodiment of the present invention. A gate 110 is arranged over source 140, drain 150, and channel 160 regions. Insulator layer 120 is located between the gate 110 and channel 160 region. An insulator layer 130 is located between the gate 110 and source 140 and channel 160 regions. Another insulator layer 130 is located between the gate 110 and drain 150 and channel 160 regions. The insulator layer 120 includes material having a high dielectric constant of between about 6 and about 25. The material in insulator layer 120 may include, for example, silicon nitride or tantalum oxide. The insulator layers 130 include material having a low dielectric constant of between about 2.5 and about 4. The material in insulator layers 130 may include, for example, silicon dioxide or SiOF.

Figure 2:
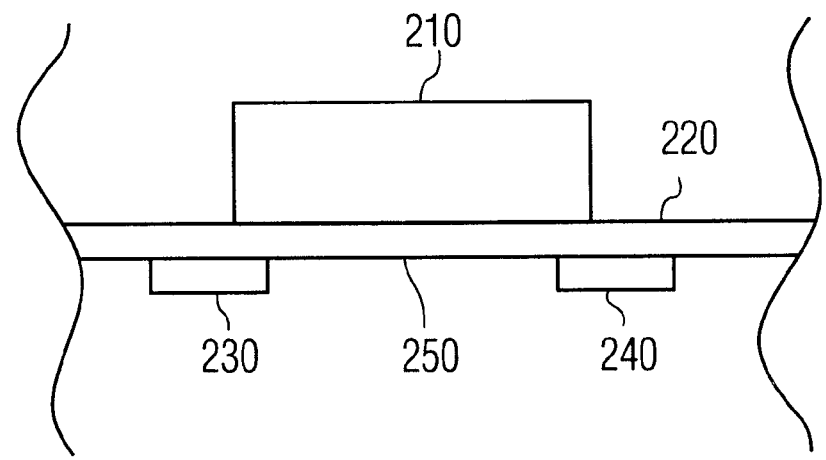
FIG. 2 is a cross-sectional view of a semiconductor device with source, drain, and channel regions, a first insulator layer having a high dielectric constant, and a gate region formed over the insulator layer, according to another example embodiment of the present invention.
Figure 3:
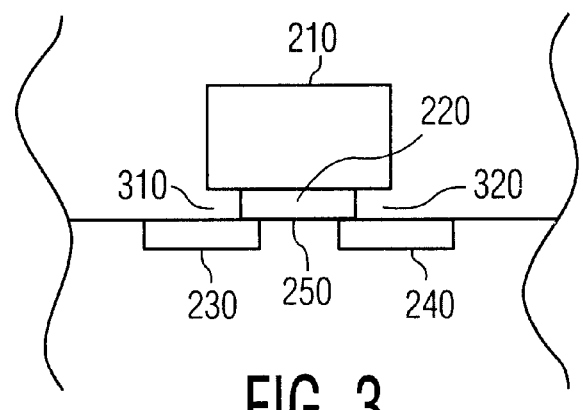
FIG. 3 is a cross-sectional view of a semiconductor device wherein part of a first insulator layer having a high dielectric constant has been removed, according to another example embodiment of the present invention.
Figure 4:
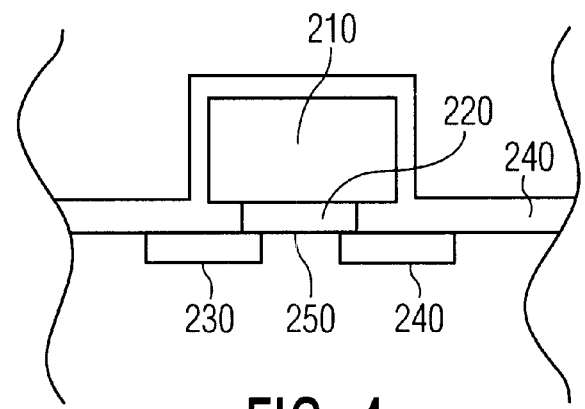
FIG. 4 is a cross-sectional view of a semiconductor device with a second insulator layer having a low dielectric constant, according to yet another example embodiment of the present invention.
Figure 5:
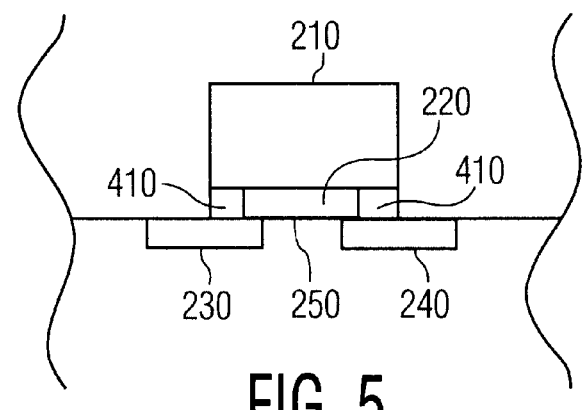
FIG. 5 is a cross-sectional view of a semiconductor device wherein part of a second insulator layer having a low dielectric constant has been removed, according to still another example embodiment of the present invention.

In another example embodiment, the present invention includes a method for manufacturing a semiconductor device having source and drain regions separated by a channel region, and having an insulator region, as shown, for example, in FIGS. 2–5. FIG. 2 shows a cut-away view of a semiconductor device having a source region 230, a drain region 240, and a channel region 250. A first insulator layer 220 having a high dielectric constant is formed over the source, drain, and channel regions. A gate 210 is formed over the first insulator layer 220 and over the source 230, drain 240, and channel 250 regions. FIG. 3 shows another cut-away view wherein the first insulator layer 220 is over-etched to form recess areas 310 and 320 at corners of the gate 210 adjacent the source 230 and drain 240 regions. The recess areas may be formed using, for example, wet-etching, as used in manufacturing for isolation technologies such as polyencapsulated local oxidation (PELOX). In an example PELOX process, isotropic etching is used to create a recess area by removing unprotected portions of a layer below a surface layer, resulting in lateral undercut of the layer below the surface area. FIG. 4 shows yet another cut-away view wherein a second insulator layer 410 is formed over the source 230, drain 240, and gate 210 regions, and extends into the recess areas as shown in FIG. 3. The second insulator layer 410 may be formed, for example, by deposition or growth in the recess areas. FIG. 5 shows another cut-away view wherein the second insulator layer 410 is partially removed, leaving only that much material which about occupies the recess areas under the gate 210.

While the present invention has been described with reference to several particular example embodiments, those skilled in the art will recognize that many changes may be made thereto without departing from the spirit and scope of the present invention, which is set forth in the following claims.

What is claimed is:

1. A semiconductor device, comprising:

a transistor having source and drain regions separated by a channel region, having a gate formed over the channel region and formed over part of the source region and over part of the drain region, and an insulator region configured and arranged to insulate the gate from the channel region and from the source and drain regions; and the insulator region having a first silicon nitride material arranged in contact with the channel region, overlapping respective portions of the source and drain regions and adapted to provide a high dielectric constant, and having a second silicon-based material arranged in contact with the part of the source region and with the part of the drain region and adapted to provide a significantly lower dielectric constant.

2. A semiconductor device, comprising:

a transistor having source and drain regions separated by a channel region, having a gate formed over the channel region and formed over part of the source region and over part of the drain region, and an insulator region configured and arranged to insulate the gate from the channel region and from the source and drain regions; and the insulator region having a first material including tantalum oxide, the insulator region arranged in contact with the channel region, overlapping respective portions of the source and drain regions and adapted to provide a high dielectric constant, and having a second silicon-based material arranged in contact with the part of the source region and with the part of the drain region and adapted to provide a significantly lower dielectric constant.

3. A semiconductor device, comprising:

a transistor having source and drain regions separated by a channel region, having a gate formed over the channel region and formed over part of the source region and over part of the drain region, and an insulator region configured and arranged to insulate the gate from the channel region and from the source and drain regions; and the insulator region having a first material including nitride, the insulator region arranged in contact with the channel region, overlapping respective portions of the source and drain regions and adapted to provide a high dielectric constant, and having a second silicon-based material including oxide and arranged in contact with the part of the source region and with the part of the drain region and adapted to provide a significantly lower dielectric constant.

* * * * *